United States Patent
Yoon et al.

(10) Patent No.: US 8,259,878 B2
(45) Date of Patent: Sep. 4, 2012

(54) APPARATUS AND METHOD FOR RECEIVING SIGNAL IN WIRELESS COMMUNICATION SYSTEM USING MULTI ANTENNA

(75) Inventors: Chanho Yoon, Daejon (KR); Hun-Sik Kang, Daejon (KR); Eun-Young Choi, Daejon (KR); Sok-Kyu Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 319 days.

(21) Appl. No.: 12/630,056

(22) Filed: Dec. 3, 2009

(65) Prior Publication Data

US 2010/0142663 A1     Jun. 10, 2010

(30) Foreign Application Priority Data

Dec. 9, 2008 (KR) .................. 10-2008-0124648
Jul. 31, 2009 (KR) .................. 10-2009-0070568

(51) Int. Cl.
*H04L 27/08* (2006.01)
(52) U.S. Cl. ..... 375/345; 455/136; 455/138; 455/200.1; 455/232.1; 455/233.1; 455/234.1; 455/234.2; 455/235.1; 455/239.1; 455/240.1; 455/241.1; 455/245.1; 455/247.1; 455/250.1; 455/251.1
(58) Field of Classification Search ............... 375/345; 455/136, 138–139, 245.1, 246.1, 247.1, 250.1, 455/251.1, 200.1, 232.1, 233.1, 234.2, 235.1, 455/239.1, 240.1, 241.1
See application file for complete search history.

(56) References Cited

U.S. PATENT DOCUMENTS

| 6,963,733 | B2* | 11/2005 | Eriksson et al. | 455/132 |
| 7,336,936 | B2* | 2/2008 | Taniguchi | 455/130 |
| 2004/0166808 | A1* | 8/2004 | Hasegawa et al. | 455/63.4 |
| 2004/0229581 | A1* | 11/2004 | Mizoguchi et al. | 455/136 |
| 2006/0165199 | A1* | 7/2006 | Takemoto et al. | 375/347 |
| 2009/0060106 | A1* | 3/2009 | Kuramoto | 375/347 |

FOREIGN PATENT DOCUMENTS

KR   10-2007-0112251   11/2007

* cited by examiner

*Primary Examiner* — Sam K Ahn
*Assistant Examiner* — Sophia Vlahos
(74) *Attorney, Agent, or Firm* — Staas & Halsey LLP

(57) ABSTRACT

Provided are apparatus and method for receiving signals in a wireless communication system. A receiving apparatus including a plurality of variable gain amplifier units configured to respectively control the gains of radio frequency (RF) signals received respectively through a plurality of antennas, and a plurality of analog-to-digital converters configured to respectively convert the output signals of the respective variable gain amplifiers into digital signals, includes: an automatic gain controller configured to calculate the gain values of the respective gain control amplifier units by receiving the digital signals outputted from the respective analog-to-digital converters, select the minimum gain value among the calculated gain control values, and calculate the differences between the minimum gain value and the other gain values; and a noise matching amplifier configured to attenuate the digital signals outputted from the respective analog-to-digital converters according to the calculated difference values.

6 Claims, 2 Drawing Sheets

APPARATUS AND METHOD FOR RECEIVING SIGNAL IN WIRELESS COMMUNICATION SYSTEM USING MULTI ANTENNA

CROSS-REFERENCES TO RELATED APPLICATIONS

The present invention claims priority of Korean Patent Application Nos. 10-2008-0124648 and 10-2009-0070568, filed on Dec. 9, 2008 and Jul. 31, 2009, respectively, which are incorporated herein by reference in their entirety.

BACKGROUND OF THE INVENTION

1. Field of the Invention

The present invention relates to an apparatus and method for receiving signals in a wireless communication system; and, more particularly, to an apparatus and method for receiving signals in a wireless communication system using a multi antenna.

2. Description of Related Art

In general, a receiver of a wireless communication system includes a variable gain amplifier (VGA) and an analog-to-digital converter (ADC). The variable gain amplifier is configured to correct the gain of a signal received by the receiver. The analog-to-digital converter is configured to convert an analog signal, outputted from the variable gain amplifier, into a digital signal.

If the variable gain amplifier excessively increases the gain of a signal received by the receiver, the output signal of the variable gain amplifier may deviate from the operation range of the analog-to-digital converter. This may cause a distortion of the received (RX) signal. On the other hand, if the variable gain amplifier excessively decreases the gain of an RX signal, a quantization noise increases, thus degrading the demodulation performance.

In a general multi-antenna system, the gains of RX signals are suitably controlled on an antenna-by-antenna basis. However, in wireless channel environments, the RX signals of the respective antennas differ in their power levels. In some case, the power level of an RX signal in an antenna is 100 or more times higher than the power level of an RX signal in another antenna. In this case, the antenna with a high RX signal power level has a low relative noise level after gain control, while the antenna with a low RX signal power level has a high relative noise level after gain control. That is, the antenna with a high RX signal power level has a high signal-to-noise ratio (SNR), while the antenna with a low RX signal power level has a low SNR.

As described above, the respective antennas of a multi-antennal system have different SNRs according to wireless channel environments. However, when gain control is performed by an automatic gain controller (AGC) and a variable gain amplifier, the output signals of the variable gain amplifier have similar average power levels. When the signals with similar average power levels are inputted into a multiple input multiple output (MIMO) system, the signal demodulation performance degrades, particularly when they are applied to a linear equalizer with low implementation complexity.

Also, when the bandwidth of an RX signal decreases or increases (i.e., varies) after the gain control by the variable gain amplifier, the voltage gain reference value of the variable gain amplifier must also vary accordingly.

SUMMARY OF THE INVENTION

An embodiment of the present invention is directed to provide an apparatus and method for receiving signals in a wireless communication system, which can prevent the degradation of demodulation performance when the respective antennas of a multi-antenna system have different signal-to-noise ratios (SNRs).

Another embodiment of the present invention is directed to provide an apparatus and method for receiving signals in a wireless communication system, which need not change the voltage gain reference value of a variable gain amplifier even when the bandwidth of a received (RX) signal varies.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided a receiving apparatus including a plurality of variable gain amplifier units configured to respectively control the gains of radio frequency (RF) signals received respectively through a plurality of antennas, and a plurality of analog-to-digital converters configured to respectively convert the output signals of the respective variable gain amplifiers into digital signals, the receiving apparatus includes: an automatic gain controller configured to calculate the gain values of the respective gain control amplifier units by receiving the digital signals outputted from the respective analog-to-digital converters, select the minimum gain value among the calculated gain control values, and calculate the differences between the minimum gain value and the other gain values; and a noise matching amplifier configured to attenuate the digital signals outputted from the respective analog-to-digital converters according to the calculated difference values.

In accordance with another aspect of the present invention, there is provided a receiving method for a receiving apparatus including a plurality of variable gain amplifier units configured to respectively control the gains of radio frequency (RF) signals received respectively through a plurality of antennas, and a plurality of analog-to-digital converters configured to respectively convert the output signals of the respective variable gain amplifiers into digital signals, the receiving method includes: calculating, by an automatic gain controller, the gain values of the respective gain control amplifier units by receiving the digital signals outputted from the respective analog-to-digital converters; selecting, by the automatic gain controller, the minimum gain value among the calculated gain control values; calculating, by the automatic gain controller, the differences between the minimum gain value and the other gain values; and attenuating, by a noise matching amplifier, the digital signals outputted from the respective analog-to-digital converters according to the calculated difference values.

DESCRIPTION OF SPECIFIC EMBODIMENTS

Figure 1:
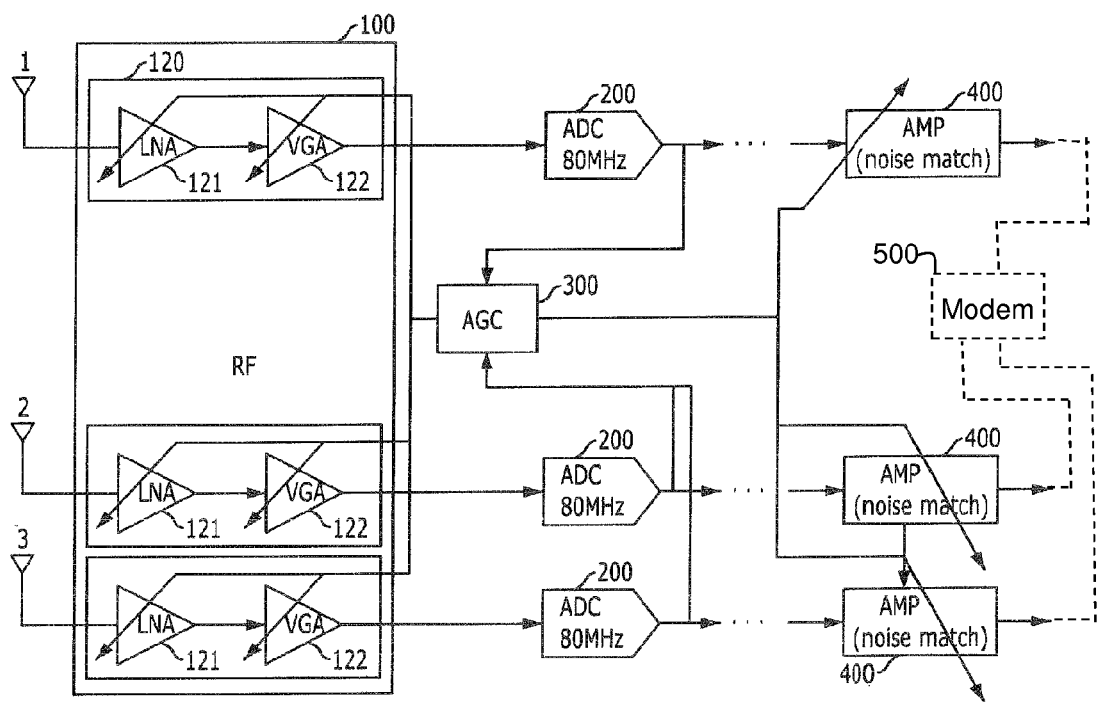
FIG. 1 is a block diagram of a receiving apparatus in accordance with an embodiment of the present invention.

The advantages, features and aspects of the invention will become apparent from the following description of the embodiments with reference to the accompanying drawings, which is set forth hereinafter.

In describing the present invention, detailed descriptions of well-known functions or configurations will be omitted in order not to unnecessarily obscure the subject matters of the present invention. The terminology used herein is for the purpose of describing particular embodiments only and is not intended to limit the scope of the present invention. Unless otherwise defined, all terms (including technical and scientific terms) used herein have the same meaning as commonly understood by those skilled in the art. In the drawings, elements irrelevant to the present invention are omitted for conciseness. Like reference numerals refer to like elements throughout the specification.

FIG. 1 is a block diagram of a receiving apparatus in accordance with an embodiment of the present invention.

Referring to FIG. 1, a receiving apparatus in accordance with an embodiment of the present invention includes a variable gain amplifier (VGA) unit 100, an analog-to-digital converter (ADC) 200, an automatic gain controller (AGC), a noise matching amplifier (AMP) 400, and a modem 500. Herein, for the convenience of description, an RX path starting from a first antenna 1 will be referred to as a first RX path, an RX path starting from a second antenna 2 will be referred to as a second RX path, and an RX path starting from a third antenna 1 will be referred to as a third RX path. The variable gain amplifier unit 100, the analog-to-digital converter 200, and the noise matching amplifier 400 are located on each of the first to third RX paths. The first to third RX paths are connected to the modem 500.

The variable gain amplifier unit 100 receives a radio frequency (RF) signal inputted through each of the first to third antennas 1 to 3. The variable gain amplifier unit 100 includes a low noise amplifier (LNA) 121 and a variable gain amplifier (VGA) 122. The variable gain amplifier unit 100 applies a gain to an inputted RF signal to amplify an RF signal comprised of an in-phase (I) signal and quadrature-phase (Q) signal. Herein, the gain applied to the RF signal depends on the power level of the inputted RF signal.

The low noise amplifier 121 may roughly control the gain of the inputted RF signal. After the low noise amplifier 121 performs a rough gain control, the variable gain amplifier 122 performs an accurate gain control. In this manner, the low noise amplifier 121 and the variable gain amplifier 122 are simultaneously used to control a gain control range according to system requirements, thereby implementing a fast and stable gain control.

The analog-to-digital converter 200 converts the RF signal, amplified by the variable gain amplifier unit 100, into a digital signal. Because the analog-to-digital converter 200 has a predetermined operation range, the amplified RF signal inputted into the analog-to-digital converter 200 must be gain-controlled by the variable gain amplifier unit 100 within the operation range of the analog-to-digital converter 200. This gain control is performed by the automatic gain controller 300.

The automatic gain controller 300 receives a digital signal outputted from the analog-to-digital converter 200 on the first RX path; calculates the difference between the digital signal and a predetermined reference signal; uses the calculated difference value to calculate a gain value for controlling the low noise amplifier 121 and the variable gain amplifier 122 on the first RX path; and provides a gain control signal corresponding to the calculated gain value to the low noise amplifier 121 and the variable gain amplifier 122 on the first RX path. Likewise, the automatic gain controller 300 calculates a gain value for controlling the low noise amplifier 121 and the variable gain amplifier 122 on the second RX path; and provides a gain control signal corresponding to the calculated gain value to the low noise amplifier 121 and the variable gain amplifier 122 on the second RX path. Likewise, the automatic gain controller 300 calculates a gain value for controlling the low noise amplifier 121 and the variable gain amplifier 122 on the third RX path; and provides a gain control signal corresponding to the calculated gain value to the low noise amplifier 121 and the variable gain amplifier 122 on the third RX path.

Also, the automatic gain controller 300 selects the minimum gain value among the calculated gain values for controlling the low noise amplifiers 121 and the variable gain amplifiers on the first to third RX paths. Thereafter, the automatic gain controller 300 calculates the differences between the selected minimum gain value and the other two gain values; and provides the calculated relative gain difference values to the noise matching amplifiers 400 on the first to second RX paths.

The noise matching amplifier 400 receives the output signal of the analog-to-digital converter 200 and the relative gain difference value outputted from the automatic gain controller 300. Thereafter, the noise matching amplifier 400 attenuates the output signal of the analog-to-digital converter 200 according to the received relative gain difference value, and outputs the resulting signal.

The modem 500 processes the signals outputted from the noise matching amplifier 400 on the first to third RX paths. The modem 500 may include a buffer, a carrier frequency offset (CFO) compensator, an fast Fourier transformer (FFT), a phase compensator, a detector, a demapper, a deinterleaver, a deparser, a decoder, a descrambler, and a medium access controller (MAC). Herein, the detector includes a linear equalizer. The linear equalizer may perform 2×3 MIMO detection, H− automatic detection, pseudo error vector magnitude (EVM) calculation, and amplitude tracking.

Hereinafter, a detailed description will be given of an operation of the receiving apparatus in accordance with an embodiment of the present invention illustrated in FIG. 1.

In FIG. 1, it is assumed that RF signals inputted into the first to third antennas 1 to 3 have different power levels. The gain of an RF signal inputted through the first 1 into the first RX path is controlled by the low noise amplifier 121 and the variable gain amplifier 122 on the first RX path; the gain of an RF signal inputted through the second antenna 2 into the second RX path is controlled by the low noise amplifier 121 and the variable gain amplifier 122 on the second RX path; and the gain of an RF signal inputted through the third antenna 3 into the third RX path is controlled by the low noise amplifier 121 and the variable gain amplifier 122 on the third RX path. The resulting signals are converted into digital signals by the respective analog-to-digital converters 200, and the digital signals are inputted into the modem 500. The digital signals, outputted from the respective analog-to-digital converters 200 on the respective RX paths, are inputted into the automatic gain controller 300. Then, the automatic gain controller 300 converts the received digital signals into gain control signals for controlling the gains of the respective low noise amplifiers 121 and the respective variable gain amplifiers 122 on the respective RX paths, and provides the respective gain control signals to the respective low noise amplifiers 121 and the respective variable gain amplifiers 122 on the respective RX paths. Hereinafter, a description will be given of a method for generating the respective gain control signals for controlling the gains of the respective low noise amplifiers 121 and the respective variable gain amplifiers 122 on the respective RX paths.

First, the automatic gain controller 300 calculates the power levels of the respective digital RF signals. Herein, it is assumed that the power level for only a predetermined period of each of the digital RF signals is calculated. For example, the power level for 0.8 μs of each of the RF signals is calculated in the case of a wireless LAN system.

If the automatic gain controller 300 is saturated during the power measurement period, the automatic gain controller 300 stops the power calculation and decreases the gain value of the variable gain amplifier unit 120 by a predetermined register value (gain large). If the automatic gain controller 300 is not saturated during the power measurement period and the calculated power value is smaller than a target value (i.e., a voltage reference value), the automatic gain controller 300 calculates the gain value to equalize the calculated power value to the voltage reference value. This method increases a gain control speed when a received RX signal has a high power level.

The automatic gain controller 300 waits for a predetermined period until a new gain value is calculated. Herein, the predetermined period is long enough to make the RF signal applicable to a gain variation. After the predetermined period, power calculation and gain update are repeated until the measured power value becomes smaller the voltage reference value, and the gain value is updated accordingly. The updated gain value is maintained as the gain value of the low noise amplifier 121 and the variable gain amplifier 122 for a predetermined time. In this way, the output signals of the automatic are not saturated, and the influence of a quantization error is minimized.

After completion of the above process, the automatic gain controller 300 selects the minimum gain value among the calculated gain values. Herein, the RX path with the minimum gain value is determined to have the highest SNR, and the other two RX paths are determined to have low SNRs. Thus, the other two RX paths with low SNRs have greater gain values than the RX path with the minimum SNR.

Thereafter, the automatic gain controller 300 calculates the differences between the minimum gain value and the other gain values, and provides the calculated gain difference values to the respective noise matching amplifiers 400 on the respective RX paths.

Then, the noise matching amplifiers 400 uses the received gain difference value to attenuate the signal outputted from the analog-to-digital converter 200.

The reason for equalizing the power levels of noise variances is that the RF signals inputted into the first to third antennas 1 to 3 need to be decorrelated by the linear equalizer of the modem 500. A signal received by a multi antenna is expressed as Equation (1).

$$r = Hx + n = \begin{bmatrix} h_{00} & h_{01} \\ h_{10} & h_{11} \\ h_{20} & h_{21} \end{bmatrix} \begin{bmatrix} x_0 \\ x_1 \end{bmatrix} + \begin{bmatrix} n_0 \\ n_1 \\ n_2 \end{bmatrix} = \begin{bmatrix} h_{00}x_0 + h_{01}x_1 + n_0 \\ h_{10}x_0 + h_{11}x_1 + n_1 \\ h_{20}x_0 + h_{21}x_1 + n_2 \end{bmatrix} \quad (1)$$

In Equation (1), 'r' denotes an RF signal received by a plurality of antennas, 'H' denotes a channel, 'x' denotes a transmitted (TX) signal, and 'n' denotes a noise. Referring to Equation (1), in order to obtain a transmitted (TX) signal 'x' by means of an RF signal 'r' received by a plurality of antennas, the linear equalizer is applied to estimate a vector 'x' of the TX signal. A process for estimating the TX signal vector 'x' is expressed as Equations (2) to (6).

$$r = Hx = \begin{bmatrix} h_{00}x_0 + h_{01}x_1 \\ h_{10}x_0 + h_{11}x_1 \\ h_{20}x_0 + h_{21}x_1 \end{bmatrix} \quad (2)$$

$$\Delta(H^H H)^{-1} H^H r = w^H r = \Delta x = \hat{x} \quad (3)$$
$$\Delta = \det(H^H H) = N_0^2 N_1^2 - |C|^2$$
$$N_0 = |h_{00}|^2 + |h_{10}|^2 + |h_{20}|^2$$
$$N_1 = |h_{01}|^2 + |h_{11}|^2 + |h_{21}|^2$$
$$C = h_{00}^* h_{01} + h_{10}^* h_{11} + h_{20}^* h_{21}$$

$$w = \Delta(H^H H)^{-1} H^H = \Delta \begin{bmatrix} N_0^2 & C \\ C^* & N_1^2 \end{bmatrix}^{-1} H^H = \begin{bmatrix} N_1^2 & -C \\ -C^* & N_0^2 \end{bmatrix} H^H \quad (4)$$
$$= \begin{bmatrix} N_1^2 h_{00}^* - Ch_{01}^* & N_1^2 h_{10}^* - Ch_{11}^* & N_1^2 h_{20}^* - Ch_{21}^* \\ N_0^2 h_{01}^* - C^* h_{00}^* & N_0^2 h_{11}^* - C^* h_{10}^* & N_0^2 h_{21}^* - C^* h_{20}^* \end{bmatrix}$$

$$H^H H = \begin{bmatrix} h_{00}^* & h_{10}^* & h_{20}^* \\ h_{01}^* & h_{11}^* & h_{21}^* \end{bmatrix} \begin{bmatrix} h_{00} & h_{01} \\ h_{10} & h_{11} \\ h_{20} & h_{21} \end{bmatrix} \quad (5)$$
$$= \begin{bmatrix} |h_{00}|^2 + |h_{10}|^2 + |h_{20}|^2 & h_{00}^* h_{01} + h_{10}^* h_{11} + h_{20}^* h_{21} \\ h_{00} h_{01}^* + h_{10} h_{11}^* + h_{20} h_{21}^* & |h_{01}|^2 + |h_{11}|^2 + |h_{21}|^2 \end{bmatrix}$$
$$= \begin{vmatrix} N_0^2 & C \\ C^* & N_1^2 \end{vmatrix}$$

$$\hat{x}_i = w^H r = \begin{bmatrix} N_1^2 h_{00}^* - Ch_{01}^* & N_1^2 h_{10}^* - Ch_{11}^* & N_1^2 h_{20}^* - Ch_{21}^* \\ N_0^2 h_{01}^* - C^* h_{00}^* & N_0^2 h_{11}^* - C^* h_{10}^* & N_0^2 h_{21}^* - C^* h_{20}^* \end{bmatrix} \quad (6)$$
$$\begin{bmatrix} h_{00}x_0 + h_{01}x_1 \\ h_{10}x_0 + h_{11}x_1 \\ h_{20}x_0 + h_{21}x_1 \end{bmatrix}$$
$$= \begin{bmatrix} N_0^2 N_1^2 x_0 + N_1^2 (h_{00}^* h_{01} + h_{10}^* h_{11} + h_{20}^* h_{21})x_1 - \\ C(h_{01}^* h_{00} + h_{11}^* h_{10} + h_{21}^* h_{20})x_0 - CN_1^2 x_1 \\ N_0^2 N_1^2 x_1 + N_0^2 (h_{01}^* h_{00} + h_{11}^* h_{10} + h_{21}^* h_{20})x_0 - \\ C^*(h_{01}^* h_{01} + h_{10}^* h_{11} + h_{20}^* h_{21})x_1 - C^* N_0^2 x_0 \end{bmatrix}$$
$$= \begin{bmatrix} (N_0^2 N_1^2 - |C|^2)x_0 \\ (N_0^2 N_1^2 - |C|^2)x_1 \end{bmatrix} = \begin{bmatrix} \Delta x_0 \\ \Delta x_1 \end{bmatrix}$$
$$\Delta = \det(H^H H)$$

When the TX signal vector 'x' is processed by the linear equalizer, the influence of noise variance can be disregarded. The influence of noise variance on RX performance is expressed as Equations (7) to (10).

$$\hat{x} = w^H (Hx) + \quad (7)$$
$$w^H n \begin{bmatrix} w_{00}^* & w_{10}^* & w_{20}^* \\ w_{01}^* & w_{11}^* & w_{21}^* \end{bmatrix} \left( \begin{bmatrix} h_{00} & h_{01} \\ h_{10} & h_{11} \\ h_{20} & h_{21} \end{bmatrix} \begin{bmatrix} x_0 \\ x_1 \end{bmatrix} \right) + \begin{bmatrix} w_{00}^* & w_{10}^* & w_{20}^* \\ w_{01}^* & w_{11}^* & w_{21}^* \end{bmatrix} \begin{bmatrix} n_0 \\ n_1 \\ n_2 \end{bmatrix}$$

The portion in Equation (7) influenced by the noise is expressed as Equation (8).

$$w^H n = \begin{bmatrix} w_{00}^* & w_{10}^* & w_{20}^* \\ w_{01}^* & w_{11}^* & w_{21}^* \end{bmatrix} \begin{bmatrix} n_0 \\ n_1 \\ n_2 \end{bmatrix} = \begin{bmatrix} w_{00}^* n_0 + w_{10}^* n_1 + w_{20}^* n_2 \\ w_{01}^* n_0 + w_{11}^* n_1 + w_{21}^* n_2 \end{bmatrix} \quad (8)$$

The noise variance in Equation (8) is defined as Equation (9).

$$n_{var} = E[n_0^2] - E[n_0]^2 = \sigma^2 - 0 = \sigma^2 \quad (9)$$

When all the terms in Equation (9) are squared for calculation of the noise variance, the result is expressed as Equation (10).

$$n_{var} = E[|w^H n|^2] - E[w^H n]^2 \quad (10)$$
$$= |w^H|^2 \cdot E[|n|^2] - (w^H \cdot E[n])^2$$
$$= \begin{bmatrix} |w_{00}|^2 \sigma_0^2 & |w_{10}|^2 \sigma_1^2 & |w_{20}|^2 \sigma_2^2 \\ |w_{01}|^2 \sigma_0^2 & |w_{11}|^2 \sigma_1^2 & |w_{21}|^2 \sigma_2^2 \end{bmatrix}$$

As expressed in Equation (10), it is influenced by the noise variance values $\sigma^2$ of the first to third RX paths and an equalization vector 'w'. If the first to third RX paths have the same noise variance value $\sigma^2$, it can be equivalently expressed as Equation (11).

$$n_{var} = \begin{bmatrix} (|w_{00}|^2 + |w_{10}|^2 + |w_{20}|^2)\sigma^2 \\ (|w_{01}|^2 + |w_{11}|^2 + |w_{21}|^2)\sigma^2 \end{bmatrix} \quad (11)$$

If the first to third RX paths have the same noise variance value as expressed in Equation (11), the signal quality according to the use of the linear equalizer at the signal demodulation can be determined only by the norm of the equalization vector 'w', rather than by the influence of the noise on each antenna.

Also, in a wireless communication system supporting a multi bandwidth by means of the noise matching amplifier 400, the receiving apparatus in accordance with an embodiment of the present invention can effectively cover the dynamic range so that the automatic gain controller 300 can have the same voltage reference value in any bandwidth unless changing a voltage reference value Vref.

Figure 2:
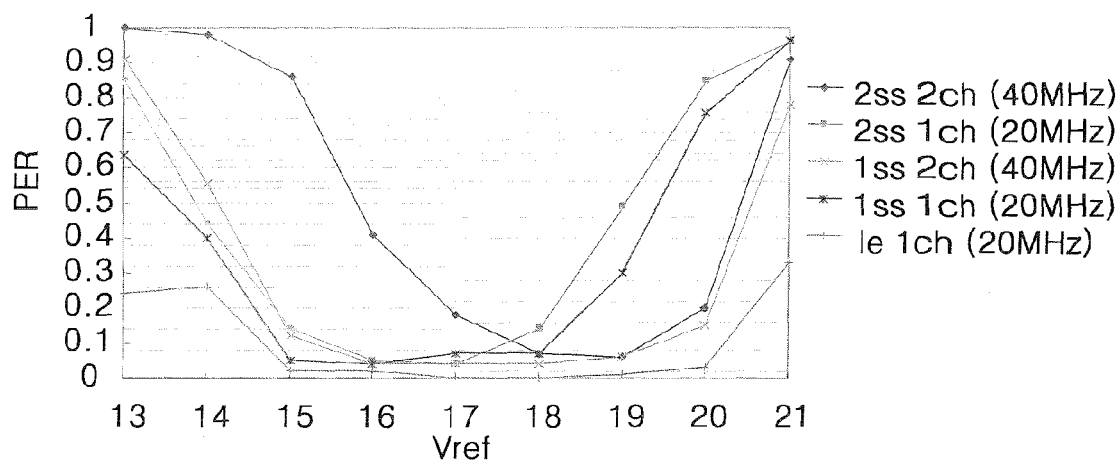
FIGS. 2 and 3 are graphs illustrating packet error rate (PER) versus voltage reference value when a bandwidth is 20 MHz or 40 MHz.
Figure 3:
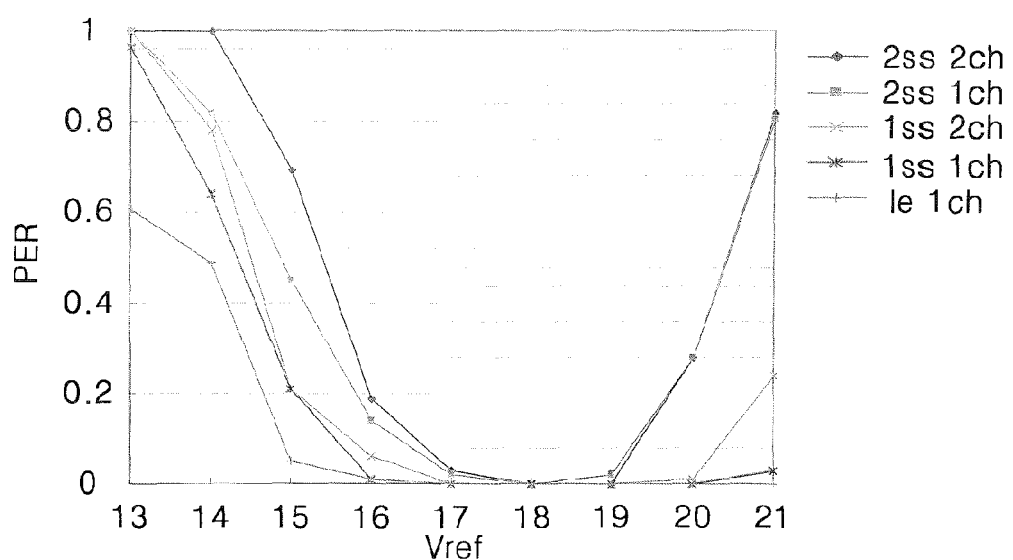

FIGS. 2 and 3 are graphs illustrating packet error rate (PER) versus voltage reference value when a bandwidth is 20 MHz or 40 MHz.

It can be seen from FIG. 2 that the voltage reference value Vref resulting in the best performance differs per bandwidth and the range of the voltage reference value Vref is lower than 40 MHz when receiving a 20 MHz bandwidth signal. Thus, when the final output size is reduced by 20 MHz according to the bandwidth information of the noise matching amplifier 400, it results in similar voltage reference value ranges, as can be seen from FIG. 3.

As described above, the use of the apparatus and method according to the present invention makes it possible to nearly equalize the noise variances of antennas. Also, the present invention has the advantage of not changing the voltage gain reference value of a variable gain amplifier.

While the present invention has been particularly shown and described with reference to preferred embodiments thereof, it will be understood by those skilled in the art that various changes in form and details may be made therein without departing from the spirit and scope of the invention as defined by the appended claims. Thus, the preferred embodiments should be considered in descriptive sense only and not for the purpose of limitation. Therefore, the scope of the present invention is defined not by the detailed description of the invention but by the appended claims, and all differences within the scope will be construed as being included in the present invention.

What is claimed is:

1. A receiving apparatus including a plurality of variable gain amplifier units configured to respectively control the gains of radio frequency (RF) signals received respectively through a plurality of antennas, and a plurality of analog-to-digital converters configured to respectively convert the output signals of the plurality of variable gain amplifier units into digital signals, the receiving apparatus comprising:
    an automatic gain controller configured to calculate gain values of plurality of variable gain amplifier units by receiving the digital signals outputted from the plurality of analog-to-digital converters, select the minimum gain value among the calculated gain values, and calculate difference values between the minimum gain value and the other gain values; and
    a noise matching amplifier configured to attenuate the digital signals outputted from the plurality of analog-to-digital converters according to the calculated difference values.

2. The receiving apparatus of claim 1, wherein each of the plurality of variable gain amplifier units comprises a low noise amplifier and a variable gain amplifier.

3. The receiving apparatus of claim 1, further comprising a modem configured to process the output signals of the noise matching amplifier.

4. A receiving method for a receiving apparatus including a plurality of variable gain amplifier units configured to respectively control the gains of radio frequency (RF) signals received respectively through a plurality of antennas, and a plurality of analog-to-digital converters configured to respectively convert the output signals of the plurality of variable gain amplifier units into digital signals, the receiving method comprising:
    calculating, by an automatic gain controller, gain values of the plurality of variable gain amplifier units by receiving the digital signals outputted from the plurality of analog-to-digital converters;
    selecting, by the automatic gain controller, the minimum gain value among the calculated gain values;
    calculating, by the automatic gain controller, the difference values between the minimum gain value and the other gain values; and
    attenuating, by a noise matching amplifier, the digital signals outputted from the plurality of analog-to-digital converters according to the calculated difference values.

5. The receiving method of claim 4, wherein each of the plurality of variable gain amplifier units comprises a low noise amplifier and a variable gain amplifier.

6. The receiving apparatus of claim 4, further comprising:
    inputting the output signals of the noise matching amplifier into a linear equalizer of a modem.

* * * * *